US012745608B2

(12) United States Patent
Lian et al.

(10) Patent No.: US 12,745,608 B2
(45) **Date of Patent: *Sep. 22, 2026**

(54) ENDPOINT DETECTION IN LOW OPEN AREA AND/OR HIGH ASPECT RATIO ETCH APPLICATIONS

(71) Applicant: Applied Materials, Inc., Santa Clara, CA (US)

(72) Inventors: Lei Lian, Fremont, CA (US); Quentin Walker, Santa Clara, CA (US); Zefang Wang, Santa Clara, CA (US); Shinichi Koseki, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 116 days.

This patent is subject to a terminal disclaimer.

(21) Appl. No.: 18/779,953

(22) Filed: Jul. 22, 2024

(65) Prior Publication Data

US 2024/0379469 A1 Nov. 14, 2024

Related U.S. Application Data

(63) Continuation of application No. 17/675,900, filed on Feb. 18, 2022, now Pat. No. 12,046,522.

(51) Int. Cl.
*H10P 74/00* (2026.01)
*G01J 1/18* (2006.01)
*H01J 37/32* (2006.01)

(52) U.S. Cl.
CPC .............. *H10P 74/238* (2026.01); *G01J 1/18* (2013.01); *H01J 37/32963* (2013.01); *H01J 2237/24507* (2013.01); *H01J 2237/334* (2013.01)

(58) Field of Classification Search
None
See application file for complete search history.

(56) References Cited

U.S. PATENT DOCUMENTS 7,158,221 B2 1/2007 Davis et al.
7,815,812 B2 10/2010 Davis et al.
(Continued)

FOREIGN PATENT DOCUMENTS

JP 2012079878 A 4/2012
JP 2014072269 A 4/2014
(Continued)

OTHER PUBLICATIONS

International Search Report and Written Opinion for PCT Application US2022/051394 dated Apr. 11, 2023.
(Continued)

*Primary Examiner* — Shamim Ahmed
(74) *Attorney, Agent, or Firm* — Patterson + Sheridan, LLP

(57) ABSTRACT

Disclosed herein is a method for determining the endpoint of an etch operation used for forming high aspect ratio features and/or over low open area (<1%) on a substrate in a processing chamber. The method begins by obtaining a reference emission curve. An etch operation is performed on a patterned substrate. A plasma optical emission intensity is measured for each of the etch cycles. A differential curve between the reference emission and the plasma optical emissions is calculated. And endpoint is determined for the etch operation on the first substrate based on an inflection point detection or other unique features through pattern recognition in the differential curve for stopping the etch of the first substrate.

14 Claims, 5 Drawing Sheets

(56) References Cited

U.S. PATENT DOCUMENTS

| | | | | |
|---|---|---|---|---|
| 8,009,938 | B2 | 8/2011 | Davis et al. | |
| 8,130,382 | B2 | 3/2012 | Lian et al. | |
| 9,601,396 | B2 | 3/2017 | Lian | |
| 2004/0018647 | A1 | 1/2004 | Jones et al. | |
| 2012/0029152 | A1 | 2/2012 | Fukuoka et al. | |
| 2014/0106476 | A1 | 4/2014 | Sevillano | |
| 2019/0019734 | A1* | 1/2019 | Jung | H01L 22/26 |

FOREIGN PATENT DOCUMENTS

| | | | |
|---|---|---|---|
| KR | 20030006812 | A | 1/2003 |
| KR | 101090395 | B1 | 12/2011 |
| KR | 20140049491 | A | 4/2014 |
| TW | 200905744 | A | 2/2009 |
| TW | 201037779 | A | 10/2010 |
| TW | 1605512 | B | 11/2017 |
| TW | i605512 | B | 11/2017 |
| TW | 201843753 | A | 12/2018 |

OTHER PUBLICATIONS

Taiwan Office Action for Application No. 111149383 dated Feb. 21, 2025.

Korean Office Action for Application No. 10-2024-7029996 dated May 29, 2025.

Office Action from Taiwanese Patent Application No. 114128282 dated Nov. 27, 2025.

* cited by examiner 164
150
156
152
154
158
127
COIL
POWER
SUPPLY
184
104
166
186
170
174b
174a
168
135
RF MATCH
NETWORK
126
100
103
182
90°
178
114
121
176
120
180
102
148
122
188
116
128
154
125
171
154
106
162
114
168
164
166
160
132
184
108
182
110

210
212
120

230
220
240
210
212
232
201
120

250
230
220
240
210
212
232
222
201
120

250
230
220
240

210
212
301
120

310
320
330
340
350
210
212
322
312
301
120

351
352
353
310
320
330
340
350
210
332
322
312
342
301
120

351
352
353
310
320
330
340
350

ENDPOINT DETECTION IN LOW OPEN AREA AND/OR HIGH ASPECT RATIO ETCH APPLICATIONS

CROSS REFERENCE TO RELATED APPLICATION

This Application is a continuation of U.S. Non-Provisional application Ser. No. 17/675,900, filed on Feb. 18, 2022, now U.S. Pat. No. 12,046,522, which is incorporated herein by reference in its entirety.

BACKGROUND

Field

Examples of the present disclosure generally relate to a method for detecting an endpoint of a semiconductor etch operation.

Description of the Related Art

Semiconductor device geometries have dramatically decreased in size since such devices were first introduced several decades ago. The increasing circuit densities have placed additional demands on processes used to fabricate semi-conductor devices. For example, as circuit densities increase, the pitch size decreases rapidly to sub 50 nm dimensions, whereas the vertical dimensions such as trench depth remain relatively constant, with the result that the aspect ratios for the features, i.e., their height divided by width, increases. Precise control of the dimensions of such high density and sub-micron features is critical to the reliable formation of the semiconductor devices.

Features, such as transistors and capacitors, are conventionally formed in the semiconductor device by patterning a surface of a substrate to define the lateral dimensions of the features and then etching the substrate to remove material and define the features. To form features with a desired electrical performance, the dimensions of the features must be formed within precise specifications.

Reliable endpoint detection is critical for consistent etch results regardless of variation in incoming wafers, chamber condition drift, and chamber to chamber differences. Conventional endpoint detection in etch applications rely on the analysis of emission trends or spectra collected in real time from only the current etch step. Conventional endpoint systems require either the existence of stopping layer, an open area greater than 3% or a high aspect ratio (HAR) smaller than 30:1. However, in etch applications with a low open area of less than 3% of the substrate surface area or an high aspect ratio (HAR) greater than 30:1, for example 50:1, there may not be enough ions detectable for a conventional modeling algorithm to extract the endpoint information from emission background noise. In low open area and HAR etch application, detection of an endpoint for an etch operation is challenging because the change in the plasma emission signal is significantly weaker than the intensity change caused by other factors such as step transition, interactions with the chamber components or the combination of these factors.

Therefore, a need exists for an improved etch endpoint detection technique.

SUMMARY

Disclosed herein is a method for determining the endpoint of an etch operation used for forming high aspect ratio features and/or low open area (<1%) on a substrate in a processing chamber. The method begins by obtaining a reference emission curve. A etch operation is performed on a patterned substrate. A plasma optical emission intensity is measured for each of the etch cycles. A ratio curve between the reference emission and the plasma optical emissions is calculated. And endpoint is determined for the etch operation on the first substrate based on an inflection point in the ratio curve for stopping the etch of the first substrate based on the endpoint.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Examples of the present disclosure relate to a method for detecting an endpoint for semiconductor substrate etching. In substrates having low open areas (LOA) of less than 1% of the top surface area of the substrate and high aspect ratio (HAR) etch features of greater than 30:1, the method disclosed herein for detecting the endpoint for the etch operation is possible even with the change in the plasma emission signal being significantly weaker than the intensity change caused by other factors such as step transition, interaction with the chamber components or the combination of these factors. The method enables reliable endpoint detection for consistent etch results regardless of variation in incoming wafers and chamber conditions. By capturing a reference emission signal and comparing it to a process emission signal, the emission background can be filtered out by using the current run data which enhances the sensitivity in endpoint detection significantly.

Advantageously, this new approach to endpoint detection is simpler in that the approach utilizes one reference wafer or reference operation to capture complicated plasma emission behavior that conventionally requires sophisticated modeling and is beyond many typical modeling capability for LOA and HAR etch applications. Additionally, the method disclosed below for endpoint detection is suitable for LOA and HAR etch applications performed in conventional processing systems, and thus these processing systems do not need to be replaced by more sophisticated and expensive devices.

Figure 1:
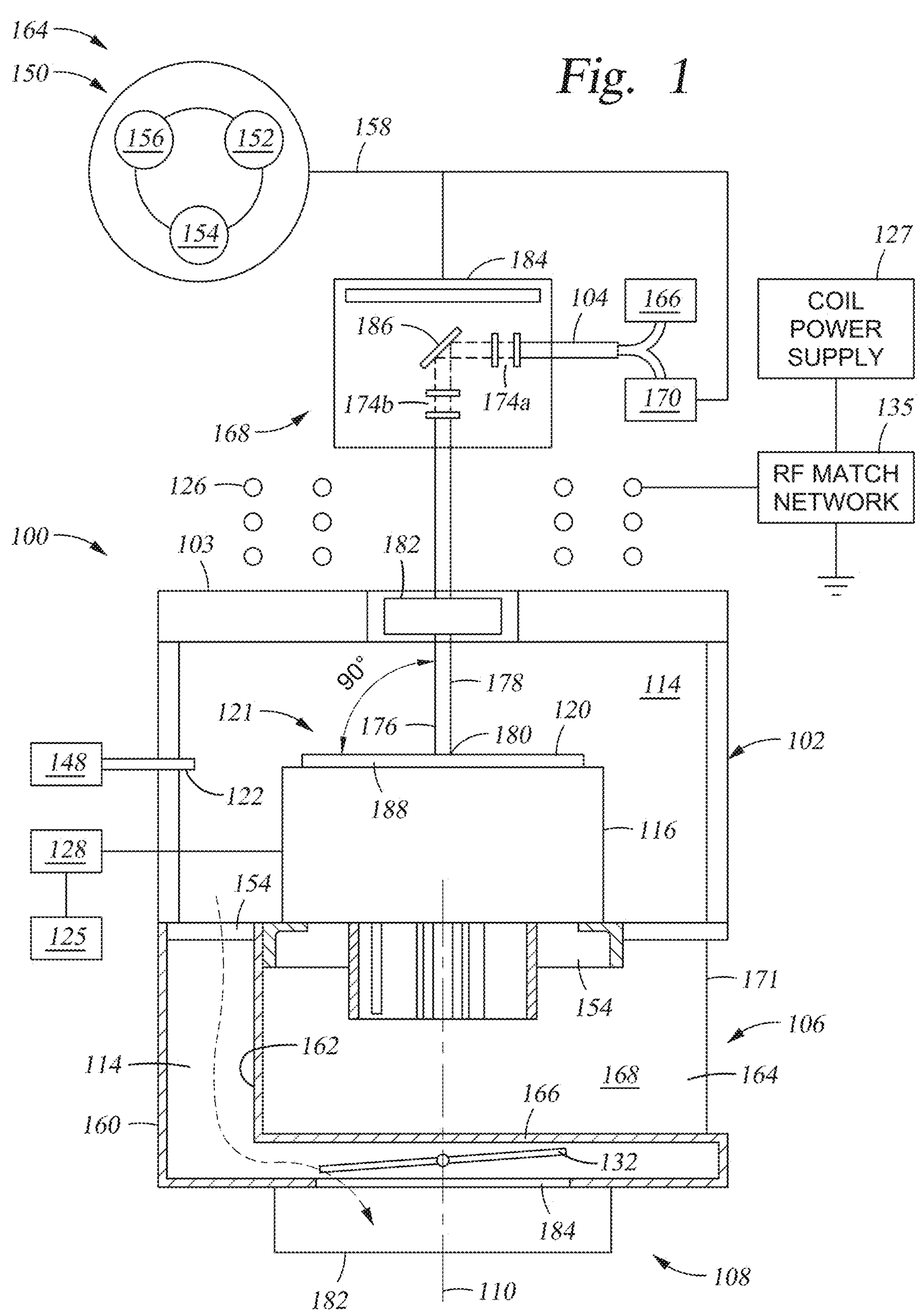
FIG. 1 is a schematic cross sectional view of a processing chamber having an optical bundle.

FIG. 1 is a schematic cross sectional view of a plasma processing chamber 100 suitable for performing an etching operation, in accordance with one example of the disclosure. Suitable processing chambers include inductively and capacitive coupled plasma etch chambers such as the TETRA® photomask etch system and the SYM3® etch system, both available from Applied Materials, Inc., of Santa Clara, California. Other types of processing chambers may benefit from the invention, including, for example, capacitive coupled parallel plate chambers, and magnetically enhanced ion etch chambers, as well as inductively coupled plasma etch chambers, among others.

The processing chamber 100 includes a chamber body 102, a flow module 160 and a ceiling 103. The ceiling 103 is energy transparent, i.e., enabling energy to be transmitted therethrough. The ceiling 103 is mounted on the chamber body 102. The chamber body 102 is mounted on the flow module 160. The chamber body 102 and the flow module 160 may be fabricated from a metal, such as anodized aluminum or stainless steel. The ceiling 103 may be flat, rectangular, arcuate, conical, dome or multi-radius shaped. The ceiling 103 is fabricated from an energy transparent material such as a ceramic or other dielectric material. An inductive coil 126 is disposed over the ceiling 103 of the processing chamber 100, and is utilized to energize gases within the chamber 100 during processing.

A substrate support 116 is disposed in the processing chamber 100 and has a substrate support surface 188 used to support a substrate 120 during processing. The substrate support 116 may include an electrostatic chuck, with at least a portion of the substrate support 116 being electrically conductive and capable of serving as a process bias cathode.

Processing gases are introduced into the processing chamber 100 from a process gas source 148 through a gas distributor 122. The gas distributor 122 may be disposed in the ceiling 103 or chamber body 102, above the substrate support 116. Mass flow controllers (not shown) for each processing gas, or alternatively, for mixtures of the processing gases, are disposed between the gas distributor 122 and the process gas source 148 to regulate the respective flow rates of the process gases into the chamber body 102.

An interior volume 114 is defined in the chamber body 102 between the substrate support 116 and the ceiling 103. A plasma is formed in the interior volume 114 from the processing gases using a coil power supply 127 which supplies power through an RF match network 135 to the inductive coil 126 to generate an electromagnetic field in the interior volume 114. The substrate support 116 may include an electrode disposed therein, which is powered by an electrode power supply 125 and generates a capacitive electric field in the processing chamber 100 through an RF match network 128. RF power is applied to the electrode in the substrate support 116 while the chamber body 102 is electrically grounded. The capacitive electric field is transverse to the plane of the substrate support 116, and influences the directionality of charged species more normal to the substrate 120 to provide more vertically oriented anisotropic etching of the substrate 120.

Process gases and etchant byproducts are exhausted from the processing chamber 100 through the flow module 160. The flow module 106 includes an outer wall 160, an inner wall 162, two or more pairs of radial walls 164 connecting between the inner wall 162 and the outer wall 160, and a bottom wall 166 attached to the inner wall 162 and the two or more pairs of radial walls 164. The outer wall 160 may include two or more through holes 171 formed between each pair of radial walls 164. A chassis 154 is sealingly disposed over the inner wall 162 and the two or more pairs of radial walls 164. The substrate support 116 is disposed on the chassis 154.

The outer wall 160 and the inner wall 162 may be cylindrical walls concentrically arranged. When assembled, a central axis of the outer wall 160 and the inner wall 162 coincides with the central axis 110 of the plasma process chamber 100. The inner wall 162, bottom wall 166, radial walls 164 and the chassis 154 divide the inner volume of the outer wall 160 into evacuation channels 114 and atmosphere volume 168. The evacuation channels 114 connect the interior volume 114 of the body 102 through the flow module 160 to an exhaust module 108.

The exhaust module 108 includes a symmetric flow valve 132 and a vacuum pump 182 attached to the symmetric flow valve 180 through a pump port 184. The symmetric flow valve 180 connects to the evacuation channels 114 to provide symmetric and uniform flow in the plasma process chamber 100. During operation, processing gas flow from the interior volume 114 out to the vacuum pump 182. The symmetric flow valve 180 additionally helps control the pressure in the processing chamber 100.

The substrate support 116 is positioned along a central axis 110 to position the substrate 120 symmetrically about the central axis 110. A plasma screen may be disposed around the substrate support 116 to confine the plasma above the substrate 120 in the interior volume 114. The flow module 160 and exhaust module 108 are configured to maintain symmetry about the central axis 110 for the plasma and the exhaust gasses for enhanced processing uniformity, such as during an etch operation.

An optical bundle 104 is configured to detect an endpoint of an etching process performed in in a processing chamber 100. The optical bundle 104 is included in an endpoint detection system 164. The endpoint detection system 164 may be an interferometer endpoint (IEP) detection system. The endpoint detection system 164 is positioned to interface with the substrate 120 through a portion of the ceiling 103. In one example, the endpoint detection system 164 is positioned to interface with a peripheral portion of the substrate 120 through a portion of the ceiling 103 that is offset from the center of the ceiling 103.

The endpoint of one or more stages of the etching process may be determined by the endpoint detection system 164. The endpoint of an etching stage may occur, for example, when a layer of the substrate 120 has been sufficiently etched through to reveal an underlying layer. Determination of the endpoint of the etching operation allows for etching of the substrate 120 to be halted once the operation has been completed, thus reducing the occurrence of overetching or underetching of the substrate 120. The endpoint detection system 164 monitors ions in the plasma to determine the extent of etching of the substrate or other conditions in the process chamber 100.

The endpoint detection system 164 may include a light source 166, a collimating assembly 168, a light detector 170, and a controller 150. The light source 166 is configured to emit a light beam through the optical bundle 104. The light beam exiting the optical bundle 104 impinges the substrate 120 and is reflected back through the optical bundle 104. The reflected light beam returns to the light detector 170 through the optical bundle 104. For example, the collimating assembly 168 is configured to focus the light beam into an incident light beam 176. The incident light beam 176 passes through the ceiling 103 in a direction perpendicular to the substrate support surface 188 and illuminates an area or beam spot 180 on the surface 121 of the substrate 120. The incident light beam 176 is reflected by the surface 121 of the substrate 120 to form a reflected light beam 178. At least a portion of the reflected light beam 178 is directed in a direction perpendicular to the substrate support surface 188 back through the ceiling 103 to the light detector 170. The light detector 170 is configured to measure the intensity of the reflected light beam 178. An exemplary light detector 170 is a spectrometer. The controller 150 calculates portions of the real-time measured waveform spectra of reflected light beam 178 reflected from the beam spot 180 on substrate 120 and processes the spectra by using advanced spectral analysis techniques, including comparing the spectra with stored characteristic waveform patterns. The chemical species within a plasma have their electrons excited to higher energy states in the formation of ions. The ions release this energy as light (called optical emission). Each specie generates light at unique wavelengths. For example, the hydrogen atom generates visible light at wavelengths 486 nm and 656 nm. Analysis of this light wavelength is called Optical Emission Spectroscopy (OES).

The OES data may be used to examine real time behavior of the chemical species in the plasma to determine a stop time, i.e., endpoint. Characteristics of OES data include measurement of plasma optical emission intensities as a function of wavelength and time to determine the relative measure of chemical changes. As the overlying material is etched away to reveal the underlying material, the chemical characteristics of the emission changes, indicative of the breakthrough of the layer signaling the endpoint of the etch.

The controller 150 includes a processor 152, a memory 154, and support circuits 156 that are coupled to one another. The controller 150 is electrically coupled to the endpoint detection system 164, including light detector 170, controller 150, and the light source 166 via a wire 158.

The processor 152 may be one of any form of general purpose microprocessor, or a general purpose central processing unit (CPU), each of which can be used in an industrial setting, such as a programmable logic controller (PLC), supervisory control and data acquisition (SCADA) systems, or other suitable industrial controller. The memory 154 is non-transitory and may be one or more of readily available memory such as random access memory (RAM), read only memory (ROM), or any other form of digital storage, local or remote. The memory 154 contains instructions, that when executed by the processor 152, facilitates execution of the method 500. The instructions in the memory 154 are in the form of a program product such as a program that implements the method of the present disclosure. The program code of the program product may conform to any one of a number of different programming languages. Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

A computer program coupled to the controller 150 performs operations on the measured waveform pattern to determine the endpoint of the etching process when the measured waveform pattern is the same as a characteristic waveform pattern. As such, the waveform signals are used to calculate the depth and etch rate. The program may also operate simple mathematic operations, such as simple subtraction, or division to evaluating a moving derivative for detecting the endpoint of the etch operation.

Figures 2A, 2B, 2C:
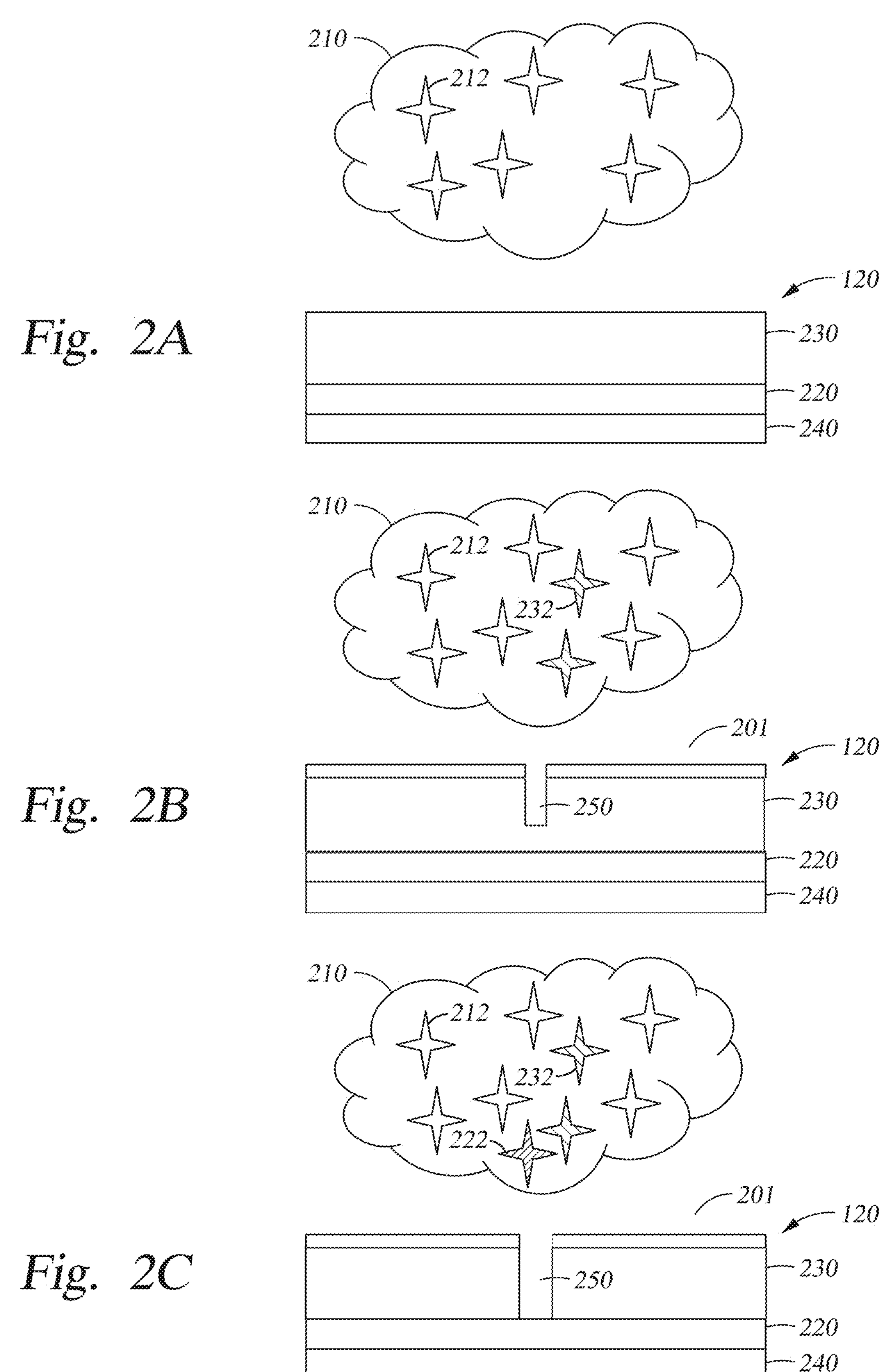
FIGS. 2A-2C illustrate chemical species within a plasma during an etch operation in a single layer of a substrate in the processing chamber shown in FIG. 1.

FIG. 2A-2C illustrate chemical species within a plasma during an etch operation in a single layer of a substrate in the processing chamber shown in FIG. 1. FIGS. 2A-2C illustrate the substrate 120 having a base layer 240, a second layer 220 and a third layer 230. A plasma 210 is maintained above the substrate 120. The plasma 210 has at least ions 212 from a chemical species that are excited to a high energy state and are configured to etch the substrate 120. Prior to etching the substrate, the plasma 210 only has ions 212 which release energy as light, i.e., the optical emissions. Analysis of the optical emission is used by the endpoint detection system 164 to determine the presence of certain chemical species within the plasma. FIG. 2B illustrates a HAR/LOA etched operation through a mask 201 for forming a feature extending into the third layer 230. The etching process introduces material, i.e., chemical species, from the third layer into the plasma 210 as layer 3 excited ions 232. In a HAR/LOA etch operation, the quantity of layer 3 excited ions 232 in the plasma 210 is small compared to the ions 212 in the plasma 210. A second layer 220 may be an etch stop layer signaling the end of the etch operation. The etching process introduces material from the second layer 220 into the plasma 210 as layer 2 excited chemical species 222. Detection of the layer 2 excited ions 222 in the plasma 210 is used by the endpoint detection system 164 to determine the end of the etch operation. The quantity of detectable layer 2 excited ions 222 in the plasma is small for HAR/LOA etch operations.

Figures 3A, 3B, 3C:
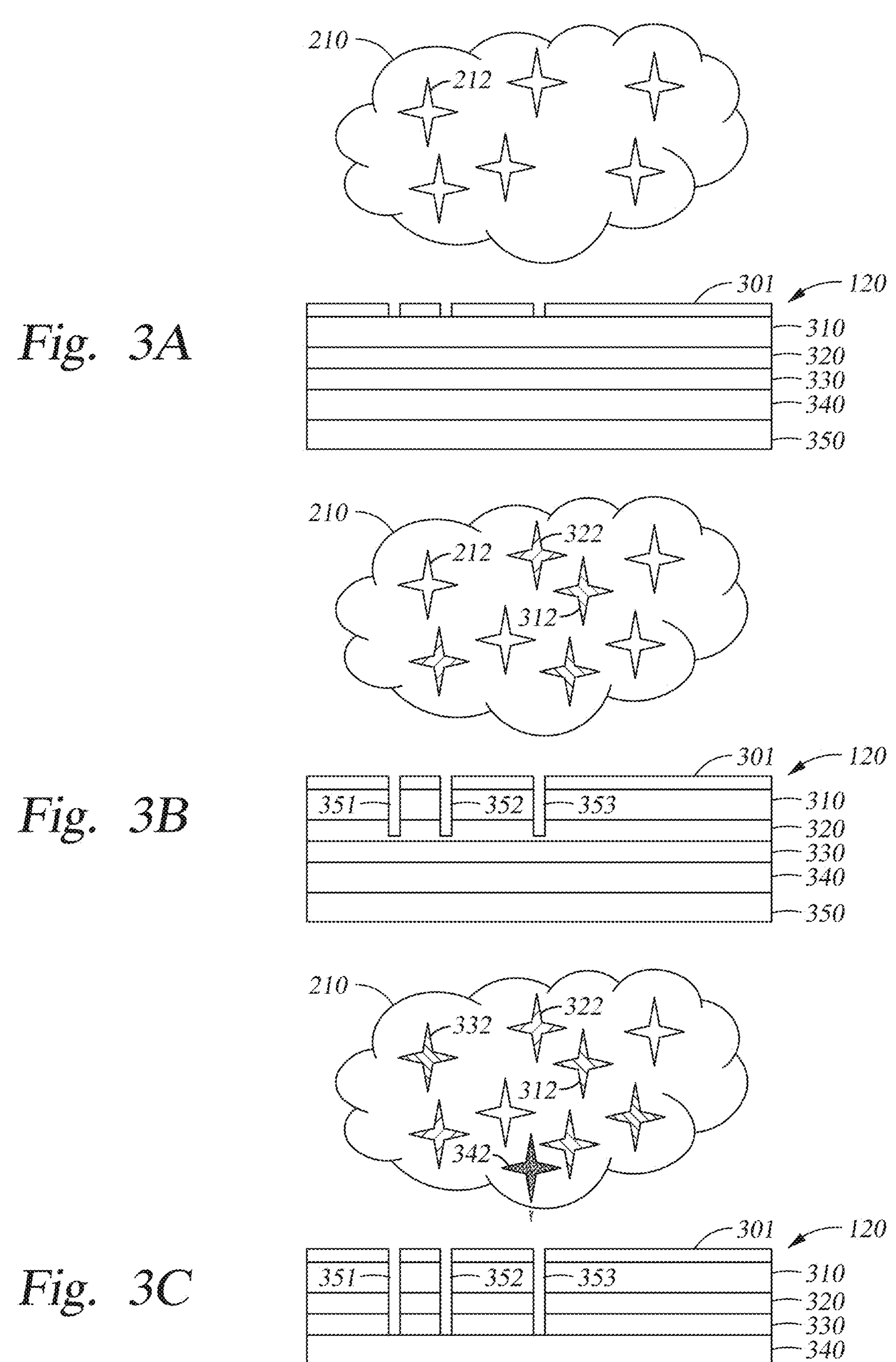
FIGS. 3A-3C illustrate chemical species within a plasma during an etch operation of a multilayer of a substrate in the processing chamber shown in FIG. 1.

FIGS. 3A-3C illustrate chemical species within a plasma during an etch operation in multiple layers of a substrate in the processing chamber shown in FIG. 1. FIGS. 3A-3C illustrate the substrate 120 having a base layer 350, an etch stop layer 340, a third layer 330, a second layer 320 and a first layer 310. A mask 301 is provided for creating features in the substrate 120. A plasma 210 is maintained above the substrate 120. The plasma 210 has at least ions 212 from a chemical species that are excited to a high energy state and are configured to etch the substrate 120. The mask 301 along with plasma 210 can be configured to perform HAR/LOA etch operations in several layers of the substrate 120. Prior to etching the substrate, the plasma 210 only has ions 212 which release energy as light, i.e., the optical emissions. Analysis of the optical emission is used by the endpoint detection system 164 to determine the presence of certain chemical species within the plasma. FIG. 3B illustrates a HAR/LOA etched operation through a mask 301 for forming a feature extending into the substrate 120. The etching process introduces material, i.e., chemical species, from the first layer 310 and the second layer 320 into the plasma 210 as layer 1 excited ions 312 and additionally as layer 2 excited ions 322. In a HAR/LOA etch operation, the quantity of layer 1 excited ions 312 and layer 2 excited ions 322 in the plasma 210 is small compared to the ions 212 in the plasma 210. The third layer 320 may be etched and also introduce layer 3 excited ions 332 into the plasma as shown in FIG. 3C. As etching through the third layer 330 continues, the via extends to the etch stop layer 340 signaling the end of the etch operation. The etch stop layer 340 introduced ESL excited ions 342 into the plasma 210. The ESL excited ions 342 is used by the endpoint detection system 164 to determine the end of the etch operation. The quantity of detectable excited ions in the plasma is small for HAR/LOA etch operations and more complicated to detect when the vias extend through several layers of the substrate prior to an etch stop layer 340.

Conventional endpoint techniques have difficulty detecting endpoints when etching substrates with low open areas and high aspect ratio of the features due to little significant change in plasma emission caused by the small transition. The emission intensity change due to removal of the material being etched diminishes and becomes essentially undetectable in the emission trend at any individual wavelength as the high aspect ratio of features become greater than 30:1 and/or low open area on the substrate is less than 1% of the top surface area of the substrate. Therefore, disclosed in FIGS. 4 through 5 are two different endpoint detection methods that amplify the endpoint transition in the OES signal by choosing the most sensitive wavelengths, normalizing the signal against background emissions within the operation, and differentiating from a reference run used in the normalization of the signal, thus making endpoint detection of the HAR and/or LOA etch process reliably detectable.

Figure 4:
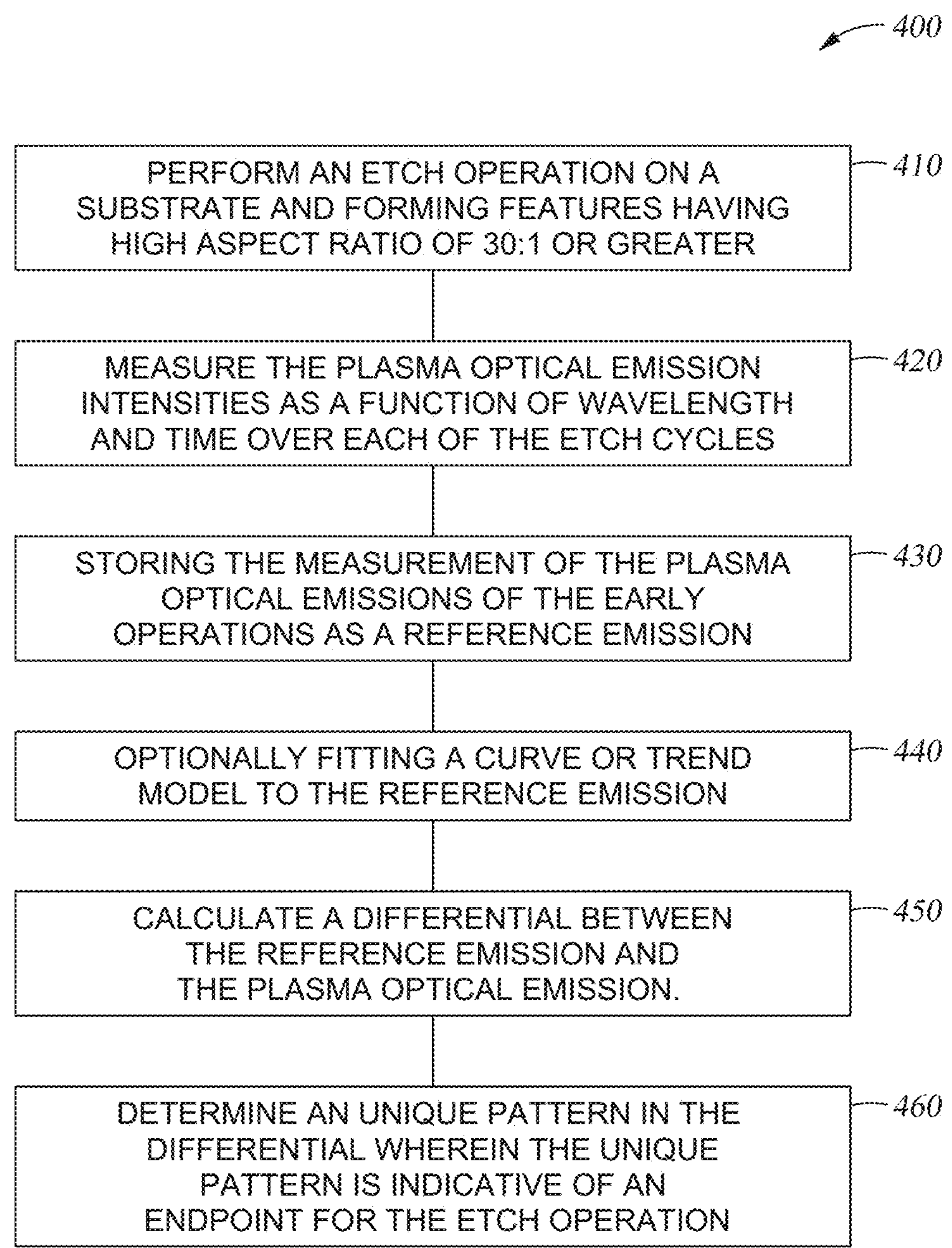
FIG. 4 is flow diagram of a first method for detecting an endpoint of a high aspect ratio etch operation performed on a semiconductor substrate.
Figure 5:
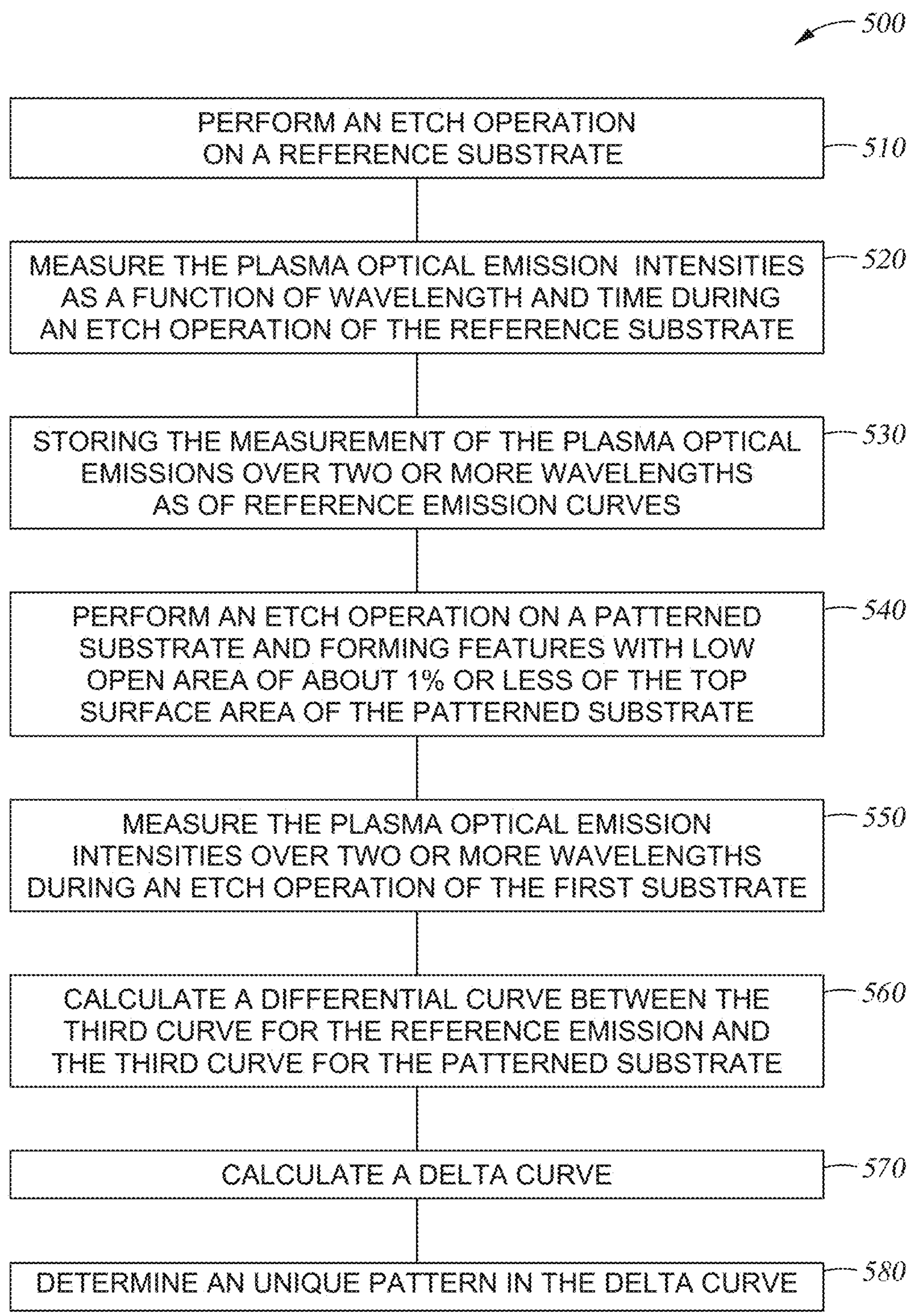
FIG. 5 is flow diagram of a second method for detecting an endpoint of a low open area etch operation performed on a semiconductor substrate.

FIG. 4 is flow diagram of a first method for detecting an endpoint for high aspect ratio etch operations of semiconductor substrates. The method begins at operation 410 by performing an etch operation on a substrate. The etch operation may be cyclic or a single step. The substrate may be a reference substrate. Alternately, the substrate may be a patterned substrate of a production batch of substrates on which features having a high aspect ratio of 30:1, or greater, such as 40:1 or 50:1, will be formed. The substrate has a processing recipe in which early in the etch operation it is known that a stop layer is not reached or that the operations are known to be confined within a one or more known layers of the substrate.

At operation 420, the plasma optical emission intensities are measured as a function of wavelength and time during the etch operation. For example, during the etch operation, an optical emission at one or more wavelengths as a function of time may be recorded. As was shown in FIG. 2A, the plasma has ions from one chemical species. When etching into a layer of material, the plasma gains additional ions from only the layer of material as shown in FIG. 2B. The measured plasma optical emissions are of the plasma and the material layer being etched.

At operation 430, the measurements of the plasma optical emissions are stored as a reference optical emission. The reference optical emission provide an indication for those etch operations that belong solely to the reference layer, i.e., the layer or layers being etched prior to reaching an underlying layer. For example, the emission may be from an etch operation of a photoresist layer and are stored as a reference or indicator of emissions for etch operations that are occurring solely in the photoresist layer. Similarly, the reference optical emission may be obtained for another layer, such as a hardmask and/or a silicon layer, and the storage of the emission data from the etch operations in the hardmask and/or silicon layer may be used as a reference for etch operations for those same layers of material. The stored reference optical emissions may be from the early operation while etching the substrate. For example, the stored reference optical emissions may be from early operations in the etch cycle where it is known that the layers the etch operation is being performed through is prior to reaching another material layer.

At operation 440, a curve, or alternatively a trend model, is fitted to the reference optical emission data. The curve may be calculated as a best fit and used as a baseline indicator of future emission evaluations. Similarly, a regression line may be used for forecasting ions in the plasma prior to the introduction of ions from an underlying layer. The reference optical emission data is used to establish a baseline or reference data for use in calculating endpoints of future etch operations. Alternately, a trend model may be used for forecasting future optical emissions. The trend model may be linear or a curve giving best average fit to the optical emission data. The trend model may be logarithmic. Alternately, the trend model may be linear. In yet other alternatives, the trend model may be a binomial curve.

At operation 450, a differential between the curve, or trend model, and the real-time plasma optical emissions for the substrate is calculated. The plasma optical emissions are observed and recorded while etching the substrate on which an endpoint to the etch operation is desired. The differential may be determined by dividing or subtracting the curve or trend model from the earlier operation from the later real-time plasma optical emissions of the substrate. The differential may be graphed to form a resultant or ratio curve. The optical emissions from the plasma in FIG. 2B start to change as the etch introduces ions from a new (second) layer (or layers) into the plasma as shown in FIG. 2C. The recognition of the change in plasma emission signal is more readily detectable with the differential curve for determining an endpoint to the etch operation.

At operation 460, a unique pattern is determined in the differential curve. The unique pattern is indicative of an endpoint for the etch operation. For example, where the plasma ions are no longer represented solely by the reference optical emissions. At the introduction of the new ions, the differential between the curve or trend model and the plasma optical emissions begins to diverge causing a change in the differential curve. An etch stop is performed at the detection of the inflection point in the differential curve. Advantageously, an etch operation forming high aspect ratio features of 30:1 or higher, such as 50:1, can be detectable when comparing the reference optical emission to the observed optical emission to detect small changes in the observed optical emission.

FIG. 5 is flow diagram of a second method for detecting an endpoint of low open area (LOA) etch operations on semiconductor substrates. The LOA is an area for the openings for the etch features of the semiconductor substrate which are less than 1% of the semiconductor substrate total surface area. The method begins at operation 510 by performing an etch operation on a substrate. The etch operation may be a cyclic or single step operation. The substrate is a reference substrate. The reference substrate has a layer of material upon which the etch operation is performed and which contribute ions into the plasma for detection. In one example, the layer of material may contain multiple layers or compounds such that multiple different chemical ion species are contributed to the plasma. In another example, the layer of material may be monolithic and contribute a limited number, such as one, chemical ionic species to the plasma.

At operation 520, the plasma optical emission intensities are measured during an etch operation of the reference substrate. The optical emissions are measured as a function of wavelength and time and provided as reference emissions. The measurement may include multiple wavelengths. For example, the reference emissions may be measured at 434 nm and at 440.5 nm, although other wavelengths may be utilized. The wavelength may be determined based on the anticipated ions in the plasma and/or the ions which will eventually be introduced into a plasma etch operation and which the reference emissions will be used in determining an etch stop. In one example, 2 or more wavelengths of the plasma optical emission are measured.

At operation 530 the measurement of the two or more wavelengths of plasma optical emissions are stored as reference emission curves. For example, a first reference emission curve may contain the measurements for a 434 nm wavelength. A second reference emission curve may contain the measurements for a 440.5 nm wavelength. Further reference emission curves at different wavelengths may be stored based on the material etched on the reference substrate. The wavelengths selected for measurement correspond to the ions of the material for the reference layer introduced into the plasma, e.g., as shown in FIG. 2B.

At operation 540, an etch operation is performed on a patterned substrate. The etch operation may be cyclic or a single step operation. The etch operation may form features on the patterned substrate having a low open area. For example, the etch operation on the patterned substrate forms features having low open areas (LOA) of less than 3% of the substrate surface area. In one example, an area of the openings for the etch features of the first substrate are less than 1% of the substrate surface area.

At operation 550, two or more wavelengths of the plasma optical emission intensities are measured during the etch operation of the patterned substrate. The two or more wavelengths correspond to the wavelengths measured with the reference substrate. For example, a first emission curve may contain the measurements for the 434 nm wavelength. A second emission curve may contain the measurements for the 440.5 nm wavelength. Further emission curves may be stored based on the material etched on the patterned substrate along with the associated corresponding reference emission data.

At operation 560, a differential curve is computed between the two or more wavelengths of the patterned substrate and separately for the two or more wavelengths of the reference substrate. A reference differential compares the measurements for the two or more separate wavelengths of the reference plasma optical emission. The reference differential is determined by computing a difference between a first curve for the first wavelength of the two or more wavelengths from a second curve for the second wavelength of the two wavelengths and so forth for the remaining wavelengths to form a third curve for the reference emission. The differential ratio may be determined by dividing the first curve for the first wavelength of the two or more wavelengths from the remaining curves for the various recorded wavelengths to form a third curve for the reference emission. Alternately, the differential curve is computed in a similar fashion through subtraction of the various wavelength curves. The patterned substrate differential compares the measurements for two or more separate wavelengths of the plasma optical emission for the patterned substrate. The patterned substrate differential is determined by dividing, or alternately subtracting, a first curve for the first wavelength of the two or more wavelengths from the curves for the remaining wavelengths of the two or more wavelengths to form a third curve for the patterned substrate.

At operation 570, a delta curve is calculated for the difference between the third curve for the reference emission and the third curve for the patterned substrate. The difference may be determined by subtracting the third curve for the reference emission from the third curve for the patterned substrate. Alternately, the difference may be determined by dividing the third curve for the reference emission from the third curve for the patterned substrate.

At operation 580, a unique pattern is determined in the delta curve. The unique pattern may be an inflection point in the delta curve. Alternately, the unique pattern may be observed as another change in the delta curve. The unique pattern is indicative of an endpoint for the etch operation. The unique pattern in the delta curve illustrates a change in the ions of the plasma. The change in ions indicate the introduction of a new material from a new layer, such as an etch stop layer, as the etch operation moves through the etch layers to the etch stop layer.

Advantageously, the methods disclosed herein capture the plasma background emission signal that is not related to the endpoint by running the etch process on a reference wafer (LOA case) and/or in an early portion, time segment, of the etch operation (HAR case) prior to onset of the endpoint on the patterned wafer. The difference between the real time optical emission signal and that of the reference signal enable detection of the endpoint. Furthermore, the methods disclosed herein advantageously provide endpoint detection for LOA and/or HAR etch applications in conventional processing chambers instead of requiring the replacement of expensive hardware.

While the foregoing is directed to specific examples, other examples may be devised without departing from the scope of the disclosure.

What is claimed is:

1. A method for detecting an endpoint for an etch operations of semiconductor substrates, the method comprising:

obtaining a reference emission from a first etch operation of a first layer of material of a first substrate of a first type of pattern, the first layer of material having a first thickness;

performing a second etch operation on a second layer of material of a second substrate of the first type of pattern, the second layer of material having a second thickness, wherein the first thickness is greater than the second thickness;

measuring a plasma optical emission during the etch operation of the second substrate;

calculating, using a processor, a differential curve between the reference emission and the plasma optical emissions;

determining an endpoint for the second etch operation on the second substrate based on a detection of a pattern in the differential curve for stopping the etch operation; and stopping the second etch operation based on the determination that the endpoint for the etch operation has been reached.

2. The method of claim 1 wherein the first etch operation on the first substrate is for forming features with high aspect ratio of 30:1 or more and obtaining the reference emission further comprises:

measuring intensities of the plasma optical emission of the first substrate early in the etch operation; and storing the measurement of the plasma optical emissions as the reference emission.

3. The method of claim 2 further comprising:

fitting a curve or trend model to the reference emission.

4. The method of claim 3, wherein the differential curve may be determined by dividing or subtracting the curve or trend model from the plasma optical emissions.

5. The method of claim 1, wherein the second etch operation on the second substrate is for forming features with low open area of about 1% or less of a top surface area and obtaining the reference emission curve further comprises:

measuring two or more wavelengths of intensities of the optical emission for the first substrate; and storing the measurement of the plasma optical emissions for the first substrate.

6. The method of claim 5, wherein storing the reference emission curve is for plasma optical emissions of two or more wavelengths of the reference emission curves and measuring intensities of the plasma optical emission of the second substrate during the second etch operation is for at least two of the same wavelengths as the reference emissions.

7. The method of claim 6 further comprising:

creating the reference emission by combining the intensities of the plasma optical emission at the two or more wavelengths for the reference emission curve; and computing a pattern curve by combining the intensities of the plasma optical emission at two or more wavelengths for the second substrate, wherein the pattern curve is used as the plasma optical emissions when calculating the differential curve.

8. A non-transitory computer readable storage medium comprising a program product which, when executed, is configured to perform an operation for detecting an endpoint for an etch operation of semiconductor substrates, the operation comprising:

obtaining a reference emission from a first etch operation of a first layer of material of a first substrate of a first type of pattern, the first layer of material having a first thickness;

performing a second etch operation on a second layer of material of a second substrate of the first type of pattern, the second layer of material having a second thickness, wherein the first thickness is greater than the second thickness;

measuring a plasma optical emission during the etch operation of the second substrate;

calculating, using a processor, a differential curve between the reference emission and the plasma optical emissions;

determining an endpoint for the second etch operation on the second substrate based on a detection of a pattern in the differential curve for stopping the etch operation; and stopping the second etch operation based on the determination that the endpoint for the etch operation has been reached.

9. The non-transitory computer readable storage medium of claim 8, wherein the first etch operation on the first substrate is for forming features with high aspect ratio of 30:1 or more and obtaining the reference emission further comprises:

measuring intensities of the plasma optical emission of the first substrate early in the etch operation; and storing the measurement of the plasma optical emissions as the reference emission.

10. The non-transitory computer readable storage medium of claim 9 further comprising:

fitting a curve or trend model to the reference emission.

11. The non-transitory computer readable storage medium of claim 10, wherein the differential curve may be determined by dividing or subtracting the curve or trend model from the plasma optical emissions.

12. The non-transitory computer readable storage medium of claim 8, wherein the second etch operation on the second substrate is for forming features with low open area of about 1% or less of a top surface area and obtaining the reference emission curve further comprises:

measuring two or more wavelengths of intensities of the optical emission for the first substrate; and storing the measurement of the plasma optical emissions for the first substrate.

13. The non-transitory computer readable storage medium of claim 12, wherein storing the reference emission curve is for plasma optical emissions of two or more wavelengths of the reference emission curves and measuring intensities of the plasma optical emission of the second substrate during the second etch operation is for at least two of the same wavelengths as the reference emissions.

14. The non-transitory computer readable storage medium of claim 13 further comprising:

creating the reference emission by combining intensities of the plasma optical emission at the two or more wavelengths for the reference emission curve; and computing a pattern curve by combining the intensities of the plasma optical emission at two or more wavelengths for the second substrate, wherein the pattern curve is used as the plasma optical emissions when calculating the differential curve.

* * * * *